United States Patent

Patil et al.

[11] Patent Number: 5,907,333
[45] Date of Patent: *May 25, 1999

[54] INK JET PRINT HEAD CONTAINING A RADIATION CURABLE RESIN LAYER

[75] Inventors: Girish Shivaji Patil; Paul Timothy Spivey; Gary Raymond Williams, all of Lexington, Ky.

[73] Assignee: Lexmark International, Inc. Lexington, Ky.

[*] Notice: This patent issued on a continued prosecution application filed under 37 CFR 1.53(d), and is subject to the twenty year patent term provisions of 35 U.S.C. 154(a)(2).

[21] Appl. No.: 08/827,564

[22] Filed: Mar. 28, 1997

[51] Int. Cl.$^6$ ..................................................... B41J 2/235
[52] U.S. Cl. ................................ 347/20; 347/63; 347/65; 156/310; 156/335; 156/292
[58] Field of Search ..................... 347/65, 64, 63, 347/20; 156/310, 335, 292

[56] References Cited

U.S. PATENT DOCUMENTS

| | | | |
|---|---|---|---|
| 4,090,936 | 5/1978 | Barton | 204/159.18 |
| 4,173,476 | 11/1979 | Smith et al. | 430/280 |
| 4,297,401 | 10/1981 | Chern et al. | 428/1 |
| 4,392,013 | 7/1983 | Ohmura et al. | 174/68.5 |
| 4,401,537 | 8/1983 | Chern et al. | 204/159.11 |
| 4,609,427 | 9/1986 | Inamoto et al. | 156/633 |
| 4,623,676 | 11/1986 | Kistner | 522/15 |
| 4,666,823 | 5/1987 | Yokota et al. | 430/320 |
| 4,688,053 | 8/1987 | Noguchi et al. | 346/140 R |
| 4,688,056 | 8/1987 | Noguchi et al. | 346/140 R |
| 4,775,445 | 10/1988 | Noguchi | 156/637 |
| 4,948,645 | 8/1990 | Holzinger et al. | 428/40 |
| 5,275,695 | 1/1994 | Chang et al. | 156/661.1 |
| 5,290,667 | 3/1994 | Shiba et al. | 430/328 |
| 5,297,331 | 3/1994 | Childers | 29/611 |
| 5,334,999 | 8/1994 | Kashiwazaki et al. | 347/65 |
| 5,478,606 | 12/1995 | Ohkuma et al. | 427/555 |
| 5,578,417 | 11/1996 | Noguchi et al. | 430/280.1 |

FOREIGN PATENT DOCUMENTS

| | | | |
|---|---|---|---|
| 0432795 A1 | 6/1992 | European Pat. Off. | C08L 63/00 |
| 3-084026 | 4/1991 | Japan | C08G 59/40 |
| 9-001804 | 1/1997 | Japan | B41J 2/05 |
| 9-024614 | 1/1997 | Japan | B41J 2/05 |

*Primary Examiner*—Benjamin R. Fuller
*Assistant Examiner*—Christina Annick
*Attorney, Agent, or Firm*—John A. Brady

[57] ABSTRACT

This invention relates to an ink jet print head having ink passage ways formed in a radiation cured resin layer which is attached to a substrate. The passageways are connected in fluid flow communication to an ink discharging outlet provided by an orifice plate. In order to form the passage ways in the resin layer, a resin composition is exposed to a radiation source in a predetermined pattern to cure certain regions of resin layer while other regions which provide the passage ways remain uncured. The uncured regions are removed from the resin layer leaving the desired passage ways. The resin composition to be used for forming the radiation curable layers is a resin composition comprising: a first multifunctional epoxy compound; a second multifunctional compound; a photoinitiator; and a non-photoreactive solvent.

6 Claims, 1 Drawing Sheet

INK JET PRINT HEAD CONTAINING A RADIATION CURABLE RESIN LAYER

FIELD OF THE INVENTION

This invention relates to an ink jet print head containing an improved radiation curable resin layer.

BACKGROUND OF THE INVENTION

The ink jet print head of an ink jet printer generally consists of an orifice plate containing orifices or injection parts for discharging ink for recording on a substrate, ink passage ways connecting the orifices to an ink supply and an energy imparting device for ejecting ink from the print head through the orifices. The energy for discharging the ink during recording is generated in most cases by resistance elements or piezoelectric devices.

Methods for making the ink passage ways for ink jet print heads include, for example, forming fine grooves in a thin layer of glass, metal, or plastic by cutting or etching and then bonding another thin layer of material onto the layer having such grooves formed thereon to form liquid passage ways. Another method involves forming grooves in a photosensitive resin coated on a substrate containing the energy imparting device by photo lithographic techniques. Once the grooves are formed in the photosensitive resin another thin layered material is attached to the grooved resin to form, for example, nozzle plates.

Among these methods for preparing an ink jet print head, the use of a photosensitive resin to provide at least a portion of the ink passage layer is more advantageous than other methods since the liquid passage ways can be manufactured with higher precision and yield and liquid jet recording heads can be obtained with better quality and lower cost. The photosensitive resin is required to have (1) excellent adhesion as a cured film to a substrate; (2) excellent mechanical strength and durability, when cured; and (3) excellent sensitivity and resolution upon patterning with a radiation source.

Of the known photo curable resins, U.S. Pat. No. 4,623,676 describes a radiation curable composition for use as a protective coating for a photographic element containing a polymerizable acrylic compound, a polymerizable epoxy-functional silane, a free radical aromatic complex salt photoinitiator capable of initiating polymerization of said acrylic compound, and a cationic aromatic complex salt photoinitiator capable of initiating polymerization of said epoxy functional silane.

U.S. Pat. No. 4,688,053 describes a liquid jet recording head having a layer of a radiation curable resin composition containing a linear polymer having a glass transition temperature of at least 50/C and a weight average molecular weight of at least $3.0 \times 10^4$, a monomer having an ethylenically unsaturated bond, an epoxy resin having one or more epoxy groups, and a polymerization initiator capable of generating a Lewis acid by irradiation with an active energy source.

U.S. Pat. No. 4,090,936 describes a photohardenable composition containing an organic compound having an average epoxide functionality in the range of about 1 to 1.3; an organic polymer selected from polymers derived from acrylate or methacrylate monomers, copolymers of styrene and allyl alcohol, and polyvinyl butyral polymers; and an aromatic complex salt aromatic complex salt photoinitiator.

However, none of the known photosensitive resins provide all of the requisite characteristics for use in jet print head applications. For example, photosensitive resins used for pattern formation in printing plates, print wires, etc., have inferior adhesion to glass, metal, ceramic and plastic, and are insufficient in mechanical strength and durability when cured although they may have good sensitivity and resolution. For these reasons when photosensitive resins are used in a print head, deformation or delamination from the substrate or degradation of the photosensitive resin layer are liable to occur during usage which reduces the reliability of the ink jet print head by impeding the flow of ink in the ink passage ways or making the ink droplet discharge noticeably unstable.

On the other hand, photo curable resins which adhere to glass, metal, ceramic and plastic, and provide satisfactory mechanical strength and durability after curing, are inferior in sensitivity and resolution. The inherent characteristics of photo curable resins makes them unsuitable for use in providing ink passage ways because they cannot be cured in the precise patterns required for use in ink jet print heads.

An object of the present invention is to provide an improved radiation curable resin for use in ink jet print heads.

Another object of the present invention is to provide an ink jet print head containing an ink passage layer made of a resin satisfying all of the requisite characteristics as mentioned above, which is inexpensive, precise, high in reliability and excellent in durability.

Yet another object of the present invention is to provide an ink jet print head having precisely manufactured ink passage ways.

SUMMARY OF THE INVENTION

The invention provides an ink jet print head containing ink passage ways in a radiation curable resin attached to a substrate containing an energy imparting device for ejecting ink from the print head. The passage ways are formed in the resin by subjecting a layer of radiation curable resin to a predetermined radiation pattern to thereby form cured regions of the resin. Uncured regions of the resin may then be removed. With regard to the above and other objects, the invention provides a radiation curable resin composition comprising: from about 5 to about 50 and preferably from about 10 to about 20 weight percent of a first multifunctional epoxy compound; from about 0.05 to about 20 and preferably from about 0.1 to about 5.0 weight percent of a second multifunctional epoxy compound; from about 1.0 to about 10 and preferably from about 1.5 to about 5 weight percent of a photoinitiator capable of generating a cation, like an aromatic complex salt photoinitiator; and from about 20 to about 90 weight percent and preferably from about 45 to about 75 weight percent of a non photoreactive solvent, wherein the weight percents are based on the total weight of the resin composition, and all ranges subsumed therein may be included.

The resin composition uses a nonphotoreactive solvent system (which could be aqueous or nonaqueous) that is environmentally acceptable. The radiation cured resin layer of the invention exhibits greater resolution, higher aspect ratios and enhanced adhesion to metal surfaces such as gold or gold/tantalum, thereby extending its application to present and projected product requirements. In addition, the cured resin provides a permanently defined and high pH ink resistant barrier layer that can contribute to controlled ink droplet size in ink jet print heads while resisting corrosion or chemical attack by the ink itself.

The radiation cured resin also results in unexpectedly superior adhesion between the nozzle plate and substrate when the nozzle plate is an alcohol coated polymer, such as a polyimide nozzle plate coated with phenolic butyral.

BRIEF DESCRIPTION OF THE DRAWINGS

The above and other features of the invention will be further described in the following detailed specification considered in conjunction with the accompanying drawing in which.

DETAILED DESCRIPTION OF THE PREFERRED EMBODIMENTS

Figure 1:
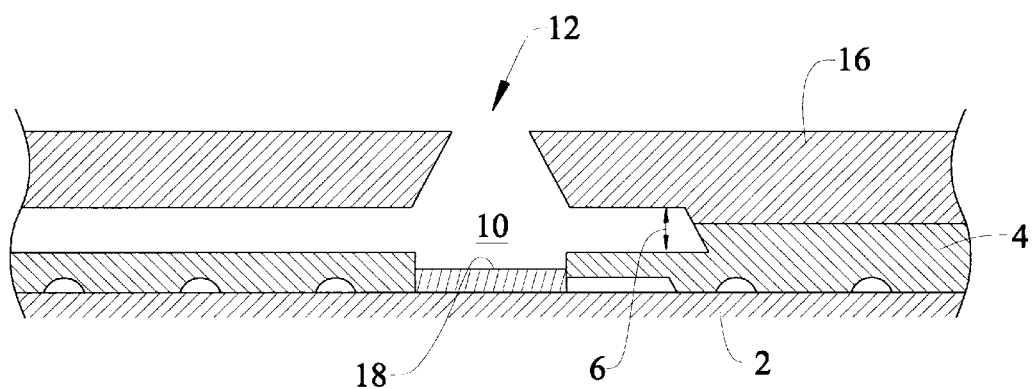
FIG. 1 is a cross-sectional view of an ink jet print head containing a radiation cured resin composition according to the invention.

This invention relates to an ink jet print head having ink passage ways formed in a radiation cured resin layer which is attached to a substrate. The passageways are connected in fluid flow communication to an ink discharging outlet provided by an orifice plate. In order to form the passage ways in the resin layer, a resin composition is exposed to a radiation source in a predetermined pattern to cure certain regions of resin layer while other regions which provide the passage ways remain uncured. The uncured regions are removed from the resin layer leaving the desired passage ways. The resin composition to be used for forming the radiation curable layers is a resin composition comprising: a first multifunctional epoxy compound, a second multifunctional epoxy compound, a photoinitiator capable of generating a cation, and a non photoreactive solvent. In a preferred embodiment, the resin composition further comprises a film enhancing agent such as an acrylate or methacrylate polymer, as well as a silane having a functional group capable of reacting with at least one member selected from the group consisting of the first multifunctional epoxy compound, the second multifunctional epoxy compound and the photoinitiator. Such a silane is preferably a silane with an epoxide functional group such as a glycidoxyalkyltrialkoxysilane like gamma-glycidoxypropyltrimethoxy-silane. The silane is present in an amount from about 0.05 to about 10 weight percent and preferably from about 0.1 to about 2.0 weight percent based on total weight of the resin composition, including all ranges subsumed therein. Film enhancing agent, as used herein, is defined to mean an organic material soluble in the resin composition which assists the film forming characteristics of the resin composition.

It is further noted herein that when no silane is employed in the curable resin composition, the amount of second multifunctional epoxy compound employed is less than about 4.5% and preferably less than about 4.0%.

The first component of the resin composition is a first multifunctional epoxy compound which includes any organic compound having preferably at least two oxirane rings polymerizable by ring opening. Therefore, multifunctional means having an average epoxide functionality of greater than 1.0 and preferably greater than or equal to 2. It is further noted that the first multifunctional epoxy compound and/or the second multifunctional epoxy compound may polymerize and/or crosslink. Preferably, the second multifunctional epoxy compound is the primary crosslinking agent. The first multifunctional epoxy compound is preferably a difunctional epoxy compound which includes monomeric difunctional epoxy compounds and polymeric difunctional epoxy compounds which may vary in the nature of their backbone and substituent groups. Furthermore, the first multifunctional epoxy compound preferably has a hydroxy group as a substituent. In addition to the preferred hydroxy group substituent, other permissible substituent groups include, for example, halogens, ester groups, ethers, sulfonate groups, siloxane groups, nitro groups, and phosphate groups. The molecular weight ($M_N$) of the first multifunctional epoxy compounds may vary from about 75 to about 100,000.

The difunctional epoxy compound or mixture of difunctional epoxy compounds are preferably liquids, however, one or more solid difunctional epoxy compounds may be included in the mixture provided that the final mixture is in a liquid phase.

Difunctional epoxy compounds which may be used include diglycidyl ethers of Bisphenol A (e.g. those available under the trade designations "Epon 828", "Epon 1004", "Epon 1001F", "Epon SU-8" and "Epon 1010" from Shell Chemical Co., "DER-331", "DER-332", and "DER-334" from Dow Chemical Co.), 3,4-epoxycyclohexylmethyl-3,4-epoxycyclohexene carboxylate (e.g. "ERL-4221" from Union Carbide Corp.), 3,4-epoxy-6-methylcyclohexylmethyl-3,4-epoxy-6-methylcyclohexene carboxylate (e.g. "ERL-4201" from Union Carbide Corp.), bis(3,4-epoxy-6-methylcyclohexylmethyl) adipate (e.g. "ERL-4289" from Union Carbide Corp.), bis(2,3-epoxycyclopentyl) ether (e.g. "ERL-0400" from Union Carbide Corp. The difunctional epoxy compound is present in the composition in an amount of from about 5 to about 50 weight percent, preferably from about 10 to about 20 weight percent.

The second component of the resin composition is a second multifunctional epoxy compound. The second multifunctional epoxy compound preferably increases the crosslink density thereby increasing resolution and improving resistance to solvent swelling. The type of second multifunctional epoxy compound is generally not limited, as long as it is a compound capable of resulting in the desired resin. An illustrative list of such second multifunctional epoxy compound includes, for example, those which are the reaction product of phenol; aldehydes and epoxides like DEN-431, DEN-438, DEN 439 (commercially available from Dow Plastics).

The second multifunctional epoxy compound is present in the composition in an amount of from about 0.5 to about 20 weight percent, preferably from about 1 to about 10 weight percent and most preferably from about 1 to about 5 weight percent, based on the total weight of the resin composition. When describing the first and second multifunctional compounds of this invention, compound is meant to include monomers and polymers.

The third component of the resin composition is a photoinitiator capable of generating a cation such as an aromatic complex salt photoinitiator which may be selected from onium salts of a Group VA element, onium salts of a Group VIA element, and aromatic halonium salts. These complex salts, upon being exposed to ultraviolet radiation or electron beam irradiation, are capable of generating moieties which initiate reactions with epoxides. The aromatic complex salt aromatic complex salt photoinitiator is present in the compositions in an amount of from about 1.0 to about 10 weight percent, preferably from about 1.5 to about 5 weight percent, based on the total weight of the resin composition.

Preferred aromatic complex salt photoinitiators include aromatic iodonium complex salts and aromatic sulfonium complex salts. Examples of the aromatic iodonium complex salt aromatic complex salt photoinitiators include:

diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexafluoroantimonate
2,2'-diphenyliodonium tetrafluoroborate
di(2,4-dichlorophenyl)iodonium hexafluorophosphate
di(4-bromophenyl)iodonium hexafluorophosphate
di(4-methoxyphenyl)iodonium hexafluorophosphate
di(3-carboxyphenyl)iodonium hexafluorophosphate
di(3-methoxycarbonylphenyl)iodonium hexafluorophosphate
di(3-methoxysulfonylphenyl)iodonium hexafluorophosphate
di(4-acetamidophenyl)iodonium hexafluorophosphate
di(2-benzoethienyl)iodonium hexafluorophosphate Of the aromatic iodonium complex salts which are suitable for use in the compositions of the invention the preferred salts are the diaryliodonium hexafluorophosphate and the diaryliodonium hexafluoroantimonate. These salts are preferred because, in general, they are more thermally stable, promote faster reaction, and are more soluble in inert organic solvents than are other aromatic iodonium salts of complex ions.

Examples of aromatic sulfonium complex salt aromatic complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
diphenylnaphthylsulfonium hexafluoroarsenate
tritolysulfonium hexafluorophosphate
anisyldiphenylsulfonium hexafluoroantimonate
4-butoxyphenyidiphenylsulfonium tetrafluoroborate
4-chlorophenyidiphenylsulfonium hexafluoroantimonate
tris(4-phenoxyphenyl)sulfonium hexafluorophosphate
di(4-ethoxyphenyl)methylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynapththyl)methylsulfonium tetrafluoroborate
di(carbomethoxyphenyl)methylsulfonium hexafluorophosphate
4-acetamidophenyldiphenylsulfonium tetrafluoroborate
dimethylnaphthylsulfonium hexafluorophosphate
trifluoromethyidiphenylsulfonium tetrafluoroborate
methyl(n-methylphenothiazinyl)sulfonium hexafluoroantimonate
phenylmethylbenzylsulfonium hexafluorophosphate Of the aromatic sulfonium complex salts which are suitable for use in the compositions of the invention the preferred salts are the triaryl-substituted salts such as triphenylsulfonium hexafluorophosphate. The triaryl-substituted salts are preferred because they are more thermally stable than the mono- and diaryl substituted salts thereby providing a one-part system with long shelf life. The triaryl-substituted complex salts are also more amenable to dye sensitization. Consequently, the use of such complex salts results in compositions which are much more useful in applications where near ultraviolet and visible light are used for exposure. If desired, the composition may be prepared in shelf stable concentrate form (i.e. with high levels of complex salt) which is suitable for later dilution to a more commercially practical coating composition.

The most preferred photoinitiator capable of generating a cation is a mixed triarylsulfonium hexafluoroantimonate salt, commercially available from Union Carbide (UVI-6974).

The fourth component of the resin composition is a nonphotoreactive solvent. This solvent is limited only to the extent that the desired components, prior to curing are soluble in it. Preferred nonphotoreactive solvents include gamma-butyrolactone, $C_{1-6}$ acetates, tetrahydrofuran, low molecular weight ketones, mixtures thereof and the like.

The nonphotoreactive solvent is present in the composition an amount of from about 20 to about 90 weight percent, preferably from about 45 to about 75 weight percent, based on the total weight of the resin composition.

Preferably, the resin composition of the present invention may include up to about 35 weight percent and preferably about 10 to about 20 weight percent of an acrylate or methacrylate polymer which is derived from at least one acrylate or methacrylate monomer. The polymer may be a homopolymer, a copolymer, or a blend. The term "polymer" as used herein is meant to include oligomers (e.g. materials having a number average molecular weight as low as about 1000) as well as high polymers (which may have a number average molecular weight ranging up to about 1,000,000). Preferably the number average molecular weight of the acrylate or methacrylate polymer is in the range of from about 10,000 to about 60,000 and most preferably from about 20,000 to about 30,000.

Preferred acrylate or methacrylate polymers may be derived from various monomers so long as at least one of those monomers is an acrylate or methacrylate monomer. For example, representative useful acrylate and methacrylate monomers include: methylmethacrylate, n-butylacrylate, hydroxyethylacrylate, hydroxyethylmethacrylate, n-butylmethacrylate, hydroxypropylacrylate, hydroxypropylmethacrylate, and ethylacrylate. Preferably, the acrylate and methacrylate monomers are esters of acrylic, or methacrylic, acid with an aliphatic alcohol of 1 to 4 carbon atoms or an aliphatic diol of 2 to 4 carbon atoms.

Representative useful acrylate or methacrylate polymers derived from the foregoing monomers include: methylmethacrylate/styrene/n-butylacrylate/hydroxyethylacrylate, methylmethacrylate/n-butylmethacrylate/hydroxyethylmethacrylate, and methylmethacrylate/n-butylmethacrylate. In general, the backbone of the acrylate or methacrylate polymer contains a major amount (by weight) of acrylate or methacrylate constituents while non-acrylate constituents, if any, represent a minor portion of the backbone.

Useful commercially available acrylate or methacrylate polymers include "Elvacite 2008", "Elvacite" 2013 (available from ICI Acrylics) which is methylmethacrylate (73)/n-butylmethacrylate(27) copolymer; "B-48N" (available from Rohm and Haas) which is an acrylic polymer; "Ionac X-208" (available from Ionac Chemical Company) which is a methylmethacrylate(44)/n-butylmethacrylate(45)/hydroxyethylacrylate(11) copolymer; "QR-572" (available from Rohm and Haas) which is a n-butylacrylate(80)/hydroxyethylacrylate(15)/vinyl acetate (5) copolymer; and "G-Cure 868" (available from General Mills) which is a methylmethacrylate(30)/n-butylacrylate (50)/hydroxyethylacrylate(20) copolymer. Combinations of acrylate or methacrylate monomers may also be used.

The resin composition of the invention may also contain various additives such as conventional fillers (e.g. barium sulfate, talc, glass bubbles) viscosity modifiers (e.g. pyrogenic silica), pigments, etc.

In one embodiment of the present invention, the composition contains from about 45 to about 75 weight percent gamma-butyrolactone, from about 10 to about 20 weight percent first multifunctional epoxy compound, from about 0.1 to about 5.0 weight percent of a second multifunctional epoxy compound, from about 1.5 to about 5 weight percent of an aromatic complex salt photoinitiator, and from about 0.1 to about 2 weight percent gamma glycidoxypropyltrimethoxy-silane. In another embodiment, the composition contains from about 45 to about 75 weight percent gamma-butyrolactone, from about 10 to about 20 weight percent polymethyl methacrylate-co-methacrylic acid, from about 10 to about 20 weight percent first functional epoxy compound, from about 0.1 to about 5.0% by weight second multifunctional epoxy compound, from about 1.5 to about 3.0 weight percent aromatic complex salt photoinitiator, and from about 0.1 to about 2 weight percent gamma glycidoxypropyltrimethoxy-silane.

A method for applying the composition to a substrate involves centering the substrate on an appropriate sized chuck of either a resist spinner or conventional wafer resist deposition track. The composition is either dispensed by hand or mechanically into the center of the substrate. The chuck holding the substrate is then rotated at a predetermined number of revolutions per minute to evenly spread the composition from the center of the substrate to the edge of the substrate. The rotational speed of the substrate may be adjusted or the viscosity of the material may be altered to vary the resulting film thickness. The resulting coated substrate is then removed from the chuck either manually or mechanically and placed on either a temperature controlled hotplate or in a temperature controlled oven until the material is "soft" baked. This step removes a portion of the solvent from the liquid resulting in a partially dried film on the substrate. The substrate is removed from the heat source and allowed to cool to room temperature.

In order to define patterns in the resulting film, the material must be masked, exposed to a collimated ultraviolet light source, baked after exposure and developed to define the final pattern by removing unneeded material. This procedure is very similar to a standard semiconductor lithographic process. The mask is a clear, flat substrate usually glass or quartz with opaque areas defining the pattern to be removed from the coated film (i.e. negative acting photoresist). The opaque areas prevent the ultraviolet light from cross linking the film masked beneath it. The non-cross linked material is then solubilized by a developer and removed leaving the predetermined pattern behind on the substrate.

The developer comes in contact with the coated substrate through either immersion and agitation in a tank-like setup or by spray. Either spray or immersion of the substrate will adequately remove the excess material as defined by the photo masking and exposure. Illustrative developers include, for example, a xylene and butyl cellosolve acetate mixture and $C_{1-6}$ acetates like butyl acetate.

Curing of the resin composition of the invention occurs on exposure of the composition to any suitable source of radiation emitting actinic radiation at a wavelength within the ultraviolet and visible spectral regions. Exposures may be from less than about 1 second to 10 minutes or more depending upon the amounts of particular epoxy materials and aromatic complex salts being utilized and depending upon the radiation source and distance from the source and the thickness of the resist pattern to be hardened. The resin compositions may also be hardened by exposure to electron beam irradiation.

The substrate of the ink jet print head containing the energy imparting devices is a dielectric layer made from glass, metal, ceramic, or silicon.

The hardening is a triggered reaction, i.e. once the degradation of the aromatic complex salt has been initiated by exposure to a radiation source, the hardening reaction proceeds and will continue after the radiation source is removed. The use of thermal energy during or after exposure to a radiation source will generally accelerate the hardening reaction, and even a moderate increase in temperature may greatly accelerate hardening rate.

The resin compositions of the invention are prepared, for example, by simply mixing the first and second multifunctional epoxy compounds, silane, acrylates, and non photoreactive solvent under conditions which do not promote curing. Once the resin mixture is prepared it is coated, for instance, onto an ink jet print head substrate by a coating technique known in the art such as spin coating, spraying, roll coating, and the like.

Referring to the drawings, FIG. 1 is a schematic illustration of the ink jet print head of the invention. The ink jet print head comprises a substrate 2, a radiation cured resin layer 4 on the substrate, an ink ejection chamber 10, an orifice 12, and a passage way 6. The passage way 6 is in fluid flow communication with the orifice 12. Orifice 12 is in nozzle plate 16, which is bonded to resin layer. The print head contains an energy imparting device 18 for discharging the ink through the orifice 12. The energy for discharging the ink is generated by applying electronic signals to the energy imparting device 18 as desired. These energy imparting devices include heat resistance elements or piezoelectric elements which are arranged in predetermined patterns on the substrate 2.

The following materials are used in the examples.

ELVACITE 2008 is a low molecular weight polymethylmethacrylate (comprising 2–3% carboxylic acid functionality) which is a nonphotoreactive, impact absorbing binder that exhibits excellent film forming capabilities as well as providing the good thermal tack and adhesion needed for thermal compression bonding. ELVACITE 2008 is available from ICI Acrylics.

EPON 1001F is a difunctional epoxy compound which adds to the tensile strength and to the elastomeric properties of the spun on film. EPON 1001F is available from Shell Chemical Company.

DEN 431 is a multifunctional epoxy resin that increases crosslink density thereby increasing resolution and improving the resistance to solvent swelling. DEN 431 is available from Dow Chemical Company.

Cyracure UVI 6974 is a aromatic complex salt photoinitiator allowing for the definition of patterns in the film when UV light is shown through an optical mask onto a film below. The resulting images are defined by developing away the uncrosslinked film leaving behind high resolution images in the epoxy thick film.

The following nonlimiting examples illustrate further aspects of the invention.

EXAMPLE 1

A 50 g/50 g solution of ELVACITE 2008 in gamma-butyrolactone was prepared. The mixture was turned for 16 hours on a roller mill. EPON 1001F, 40 grams, was crushed to a powder and added to the solution. The solution was turned for 16 hours on a roller mill. DEN 431, 10 grams, and 5 grams limonene oxide (a low viscosity liquid monofunctional epoxy) were added to the solution and mixed until the solution was homogeneous. UVI 6974, 10 grams, was added and mixed thoroughly.

The solution was spun onto a substrate used to make a printhead for an inkjet printer by means of a silicon wafer in a spinner at 2.5K rpm for 30 seconds to provide a 30 micron film which was subsequently developed. After this an inkjet nozzle plate was attached to the substrate by a conventional adhesion technique to produce an inkjet printhead. After placing the inkjet printhead in a conventional ink jet ink (at 60° C.), the nozzle plate began to detach after about 1 month.

EXAMPLE 2

A 50 g/50 g solution of ELVACITE 2008 in gamma-butyrolactone was prepared. The mixture was turned for 16 hours on a roller mill. EPON 1001F, 40 grams, was crushed to a powder and added to the solution. The solution was turned for 16 hours on a roller mill. DEN 431, 10 grams, was added to the solution and mixed until the solution was homogeneous. UVI 6974, 5 grams, was added and mixed thoroughly. To the resulting solution, 1 gram of glycidoxypropyltrimethoxy-silane was added.

The solution was spun onto a substrate used to make a printhead for an ink jet printer by means of a silicon wafer in a spinner at 2.5K rpm for 30 seconds to provide a 30 micron film which was developed. After this, a phenolic butyral coated polyimide ink jet nozzle plate was attached to the substrate by a conventional technique to produce an ink jet printhead. After placing the ink jet printhead in a conventional ink jet ink (at 60° C.), the nozzle plate did not, even remotely, begin to detach after about 1 month.

While the invention has been described with particular reference to certain embodiments thereof, it will be understood that changes and modifications may be made which are within the skill of the art within the spirit and scope of the appended claims.

We claim:

1. An ink jet print head comprising a polymeric nozzle plate having an inner layer of phenolic butyral, ink passage ways connected to nozzles of said nozzle plate, and a predominately silicon containing substrate, said passage ways being formed by subjecting a layer of a radiation curable resin composition coated on said substrate to exposure of radiation in a pattern to cure said composition in said pattern to thereby form a cured region of said resin composition, said cured region thereby being bonded on one side of said cured region to said predominately silicon containing substrate, and removing the uncured resin composition region from said layer, said radiation curable resin composition comprising:

(A) about 10 to 20 weight percent of a difunctional first epoxy compound;
    (B) less than about 4.5% by weight of a multifunctional second crosslinking epoxy compound;
    (C) about 1 to about 10 weight percent of a photoinitiator capable of generating a cation; and
    (D) about 20 to about 90 weight percent of a nonphotoreactive solvent, wherein the weight percents are based on the total weight of the resin composition;

said cured region being bonded opposite said substrate directly to said layer of phenolic butyral of said nozzle plate.

2. The ink jet print head according to claim 1 wherein the molecular weight of the first epoxy compound is from about 100 to about 100,000.

3. The ink jet print head according to claim 1 wherein the first epoxy compound is a diglycidyl ether of Bisphenol A.

4. The ink jet print head according to claim 1 wherein the photoinitiator is an aromatic complex salt photoinitiator is selected from the group consisting of onium salts of a Group VA element, onium salts of a Group VIA element, aromatic halonium salts, and combinations thereof.

5. The ink jet print head according to claim 1 wherein the resin composition further comprises up to about 35 weight percent of an acrylate or methacrylate polymer.

6. The ink jet print head according to claim 5 wherein the acrylate or methacrylate polymer is selected from the group consisting of copolymers of methylmethacrylate/n-butylmethacrylate, methylmethacrylate/n-butylmethacrylate/hydroxyethylmethacrylate, methylmethacrylate/-styrene/n-butylacrylate/hydroxyethylacrylate, styrene/hydroxyethylacrylate, and n-butylacrylate/hydroxyethylacrylate/vinyl acetate.

* * * * *